(12) United States Patent
Rachmady et al.

(10) Patent No.: US 11,031,499 B2
(45) Date of Patent: Jun. 8, 2021

(54) GERMANIUM TRANSISTOR STRUCTURE WITH UNDERLAP TIP TO REDUCE GATE INDUCED BARRIER LOWERING/SHORT CHANNEL EFFECT WHILE MINIMIZING IMPACT ON DRIVE CURRENT

(71) Applicant: Intel Corporation, Santa Clara, CA (US)

(72) Inventors: Willy Rachmady, Beaverton, OR (US); Van H. Le, Portland, OR (US); Matthew V. Metz, Portland, OR (US); Benjamin Chu-Kung, Portland, OR (US); Ashish Agrawal, Hillsboro, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/099,532

(22) PCT Filed: Jul. 2, 2016

(86) PCT No.: PCT/US2016/040901
§ 371 (c)(1),
(2) Date: Nov. 7, 2018

(87) PCT Pub. No.: WO2018/009163
PCT Pub. Date: Jan. 11, 2018

(65) Prior Publication Data
US 2019/0103486 A1 Apr. 4, 2019

(51) Int. Cl.
*H01L 29/94* (2006.01)
*H01L 29/78* (2006.01)
(Continued)

(52) U.S. Cl.
CPC .......... *H01L 29/785* (2013.01); *H01L 23/298* (2013.01); *H01L 23/3171* (2013.01);
(Continued)

(58) Field of Classification Search
CPC ............. H01L 29/0607; H01L 29/1033; H01L 23/298; H01L 23/3171; H01L 29/785
See application file for complete search history.

(56) References Cited

U.S. PATENT DOCUMENTS 9,466,669 B2    10/2016  Rodder et al.
2012/0319211 A1  12/2012  Van Dal et al.
(Continued)

FOREIGN PATENT DOCUMENTS

KR    10-2015-0126788    11/2015

OTHER PUBLICATIONS

International Search Report and Written Opinion for International Patent Application No. PCT/US2016/040901 dated Apr. 26, 2017, 13 pgs.

(Continued)

*Primary Examiner* — Samuel A Gebremariam
(74) *Attorney, Agent, or Firm* — Schwabe, Williamson & Wyatt, P.C.

(57) ABSTRACT

An apparatus including a transistor device including a channel disposed on a substrate between a source and a drain, a gate electrode disposed on the channel, wherein the channel includes a length dimension between source and drain that is greater than a length dimension of the gate electrode such that there is a passivated underlap between an edge of the gate electrode and an edge of the channel relative to each of the source and the drain. A method including forming a channel of a transistor device on a substrate; forming first and second passivation layers on a surface of substrate on opposite sides of the channel; forming a gate (Continued)

stack on the channel between first and second passivation layers; and forming a source on the substrate between the channel and the first passivation layer and a drain on the substrate between the channel and the second passivation layer.

20 Claims, 11 Drawing Sheets

(51) Int. Cl.
      *H01L 29/66*     (2006.01)
      *H01L 29/10*     (2006.01)
      *H01L 29/16*     (2006.01)
      *H01L 23/29*     (2006.01)
      *H01L 23/31*     (2006.01)
      *H01L 29/06*     (2006.01)
      *H01L 29/423*    (2006.01)
      *H01L 29/165*    (2006.01)

(52) U.S. Cl.
      CPC ...... *H01L 29/0607* (2013.01); *H01L 29/1033* (2013.01); *H01L 29/1054* (2013.01); *H01L 29/16* (2013.01); *H01L 29/42376* (2013.01); *H01L 29/66545* (2013.01); *H01L 29/66795* (2013.01); *H01L 29/165* (2013.01)

(56) References Cited

U.S. PATENT DOCUMENTS

| | | |
|---|---|---|
| 2014/0159124 A1 | 6/2014 | Doris et al. |
| 2015/0194505 A1 | 7/2015 | Asenov et al. |
| 2015/0243756 A1* | 8/2015 | Obradovic .......... H01L 29/7848 438/285 |
| 2016/0013291 A1 | 1/2016 | Jacob et al. |
| 2016/0190286 A1* | 6/2016 | Wang ................ H01L 29/66795 438/283 |
| 2016/0359045 A1* | 12/2016 | Balakrishnan .... H01L 29/66795 |

OTHER PUBLICATIONS

International Preliminary Report on Patentability for International Patent Application No. PCT/US2016/040901, dated Jan. 17, 2019, 10 pages.

Office Action from Taiwan Patent Application No. 106117690, dated Jan. 6, 2021, 2 pages.

\* cited by examiner

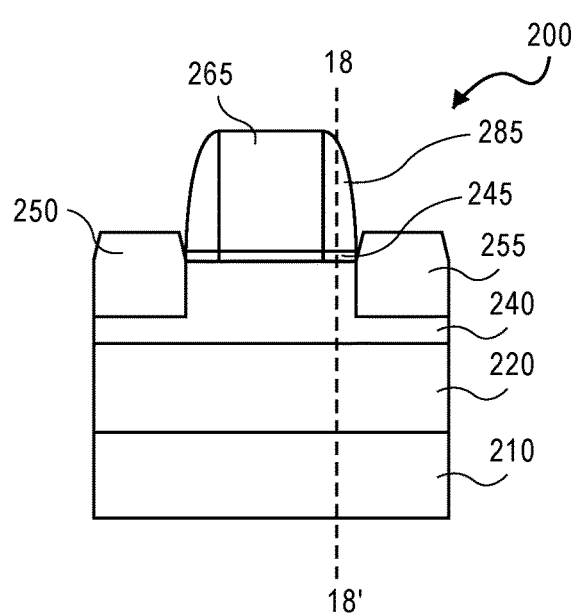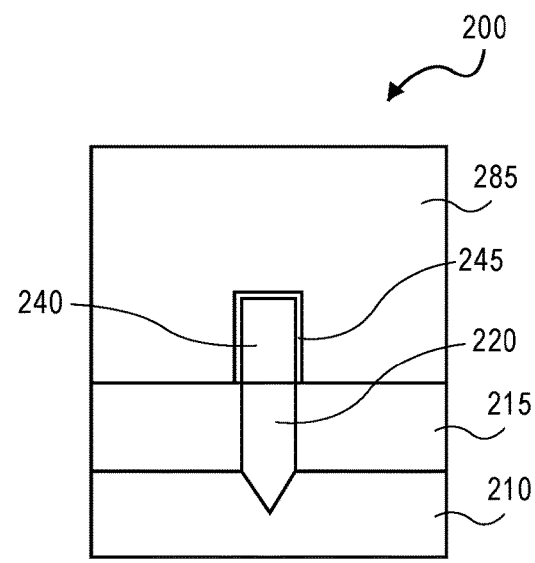
FIG. 17    FIG. 18
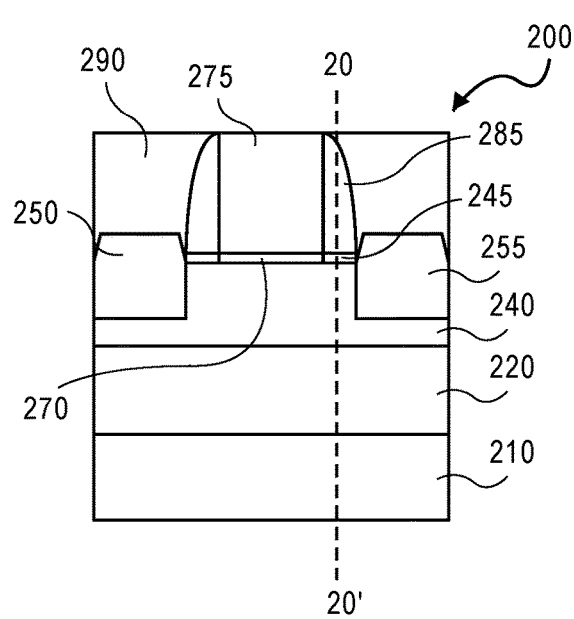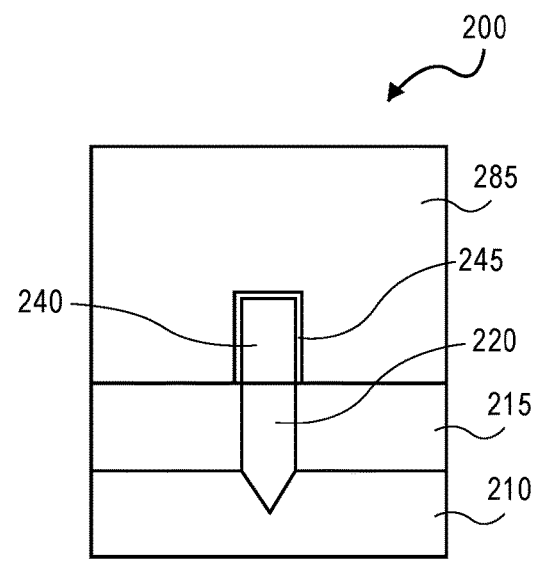
FIG. 19    FIG. 20

GERMANIUM TRANSISTOR STRUCTURE WITH UNDERLAP TIP TO REDUCE GATE INDUCED BARRIER LOWERING/SHORT CHANNEL EFFECT WHILE MINIMIZING IMPACT ON DRIVE CURRENT

CROSS-REFERENCE TO RELATED APPLICATION

This patent application is a U.S. National Phase Application under 35 U.S.C. § 371 of International Application No. PCT/US2016/040901, filed Jul. 2, 2016, entitled "GERMANIUM TRANSISTOR STRUCTURE WITH UNDERLAP TIP TO REDUCE GATE INDUCED BARRIER LOWERING/SHORT CHANNEL EFFECT WHILE MINIMIZING IMPACT ON DRIVE CURRENT," which designates the United States of America, the entire disclosure of which is hereby incorporated by reference in its entirety and for all purposes.

BACKGROUND

Field

Integrated circuit devices.

Description of Related Art

Germanium transistors in integrated circuit devices offer generally higher hole mobility than silicon which makes such transistors favorable for at least P-type devices. Because germanium has a much smaller bandgap than silicon, the effect of gate induced barrier lowering (GIDL) in the drain is more pronounced in germanium transistors. Therefore, germanium transistors tend to exhibit a higher parasitic source-drain leakage than silicon transistors.

BRIEF DESCRIPTION OF THE DRAWINGS

FIG. 17 shows the structure of FIG. 15 following the formation of a source and a drain.

FIG. 18 shows a cross-section of the structure of FIG. 17 through line 18-18'.

FIG. 19 shows the structure of FIG. 17 following the replacement of the gate stack.

FIG. 20 shows a cross-section of the structure of FIG. 19 through line 20-20'.

DETAILED DESCRIPTION

Figure 1:
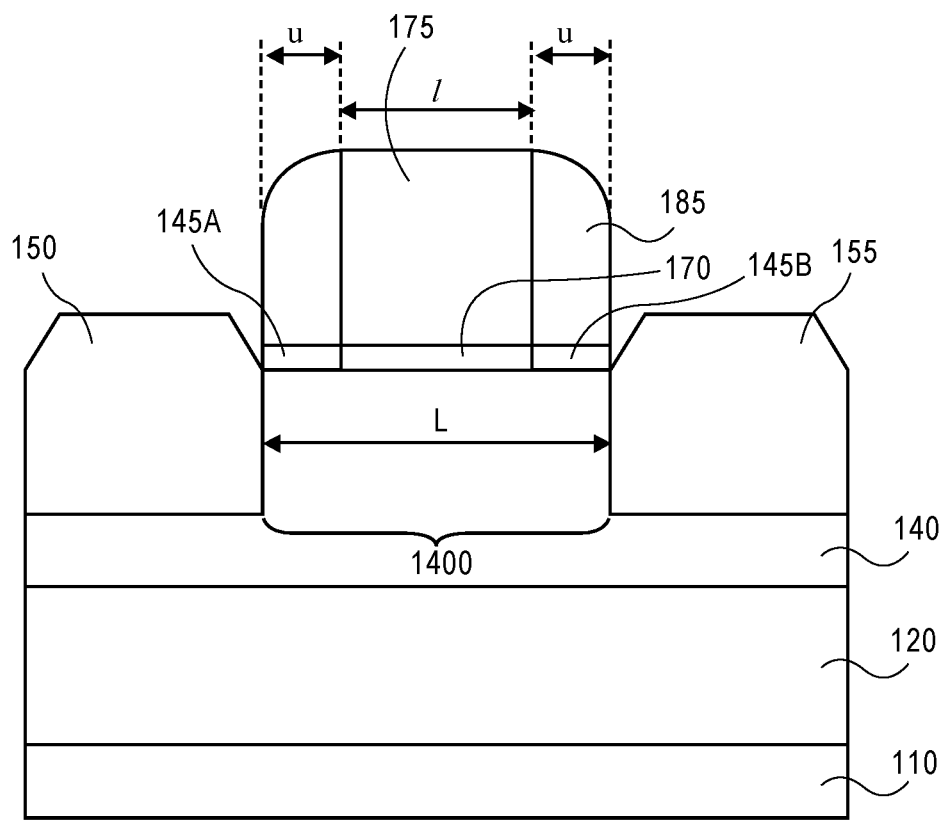
FIG. 1 shows a cross-sectional side view of an embodiment of a field effect transistor device.

FIG. 1 shows a cross-sectional side view of an embodiment of a field effect transistor (FET) device such as P-type metal oxide semiconductor FET (MOSFET). Referring to FIG. 1, device 100 includes substrate 110 that is, for example, a single crystal silicon substrate. Disposed on substrate 110, in this embodiment, is buffer layer 120. Examples of a suitable material for buffer layer 120 include, but are not limited to, one or more of gallium arsenide (GaAs), indium aluminum arsenide (InAlAs), gallium antimony (GaSb), indium phosphide (InP), indium aluminum phosphide (InAlP) and gallium aluminum antimony (GaAlSb). A representative thickness of buffer layer 120 is on the order of 150 nanometers (nm) to 250 nm.

As illustrated in FIG. 1, disposed on buffer layer 120 is intrinsic layer 140. Intrinsic layer 140, in one embodiment, is selected of a material desired for a channel of the transistor device as the intrinsic layer will include the channel of the device. In one embodiment, intrinsic layer 140 is germanium.

Formed in intrinsic layer 140 is diffusion or junction region or source 150 and diffusion or junction region or drain 155. In one embodiment, source 150 is a p$^+$ source of an PMOSFET and drain 155 is a p$^+$ drain. In one embodiment, each of source 150 and drain 155 are boron doped germanium material. Disposed between source 150 and drain 155 is channel 1400 of intrinsic layer 140. In one embodiment, channel 1400 is undoped (electrically neutral) or doped with less than 5E17 carriers of either type.

Overlying channel 1400 is a gate stack including a gate dielectric and a gate electrode. FIG. 1 shows gate dielectric layer 170 disposed on a surface of intrinsic layer 140 (a top surface as viewed). Gate dielectric material 170 is, for example, a silicon dioxide or a dielectric material having a dielectric constant greater than silicon dioxide (a high-k material) or a combination of silicon dioxide and a high-k material or multiple high-k materials. Disposed on gate dielectric layer 170 is gate electrode 175. In one embodiment, gate electrode 175 is a metal or metal compound or alloy or a silicide. Examples of material for gate electrode 175 include tungsten, titanium, tantalum or a nitride of tungsten, titanium or tantalum.

Generally, state of the art transistors include tip regions associated with a source and drain that are designed to extend into a region of the device under the gate stack (gate dielectric and gate electrode). A source tip region is formed in a region between the source and the channel and a drain tip region is formed in a region between the drain and the channel. This extension may be referred to as an overlap with the gate. An overlap amount of one nanometer (nm) to 4 nms is typical to maintain a high drive current but at a possible cost of increasing gate capacitance. In the embodiment shown in FIG. 1, there is no overlap of source or drain tip regions with the gate stack. Instead, any source and drain extensions or tips are retracted or pulled back from a gated region. This may be referred to as an underlap, u, between an edge of the gate electrode and an edge of the channel relative to each of the source and the drain. An effect is a channel having a length dimension, L, between the source and drain including any tips or extensions that is greater than a length dimension, l, of the gate electrode. A representative underlap, u, is a few nanometers or more. For a transistor with a relatively high charge carrier mobility, establishing an underlap between the gate stack and the source and the drain will have minimal impact on drive current. Benefits include reduced gate-induced drain leakage (GIDL) and improved short channel effect (SCE) relative to devices with overlap.

FIG. 1 shows a surface of intrinsic layer 140 (a top surface as viewed) is passivated in the underlap areas. FIG. 1 shows passivation layer 145A on a source side of the gate stack and passivation layer 145B on a drain side of the gate stack. A representative material for passivation layer 145A and passivation layer 145B is silicon having a thickness on the order 3 angstroms (Å) to 9 Å. In one embodiment, passivation layer 145A and passivation layer 145B serve to minimize any scattering of charge carriers in an underlap area. Overlying passivation layer 145A and passivation layer 145B and adjacent opposing sidewalls of gate electrode 170 are sidewall spacers 185 of a dielectric material such as silicon dioxide.

Figure 2:
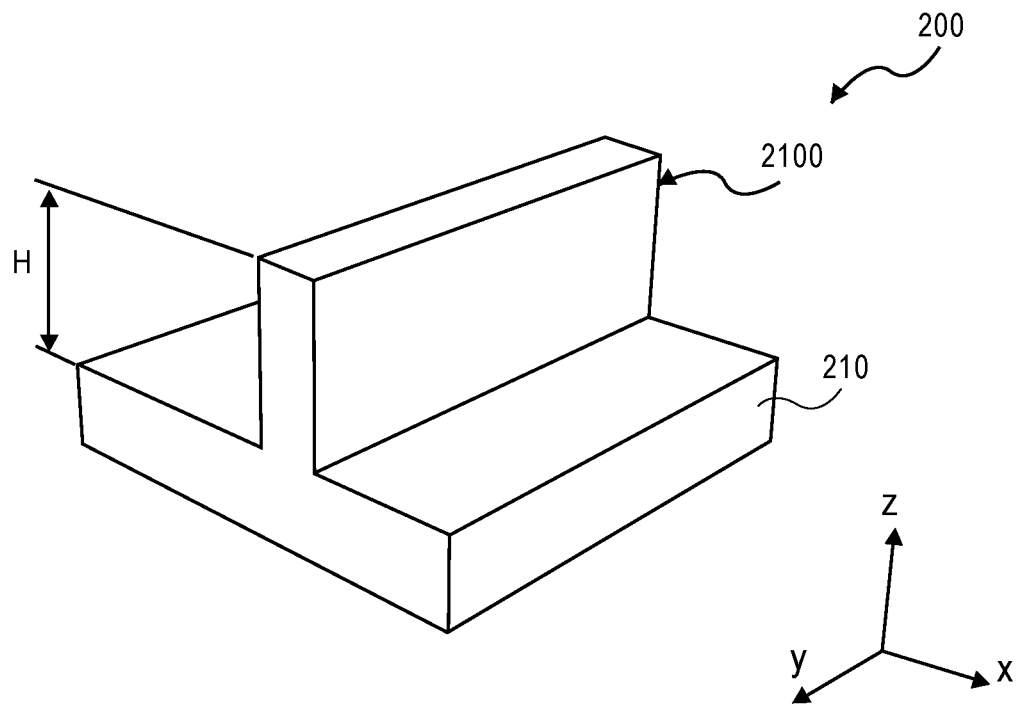
FIG. 2 shows a perspective side view of a substrate having a sacrificial fin formed therein.
Figure 21:
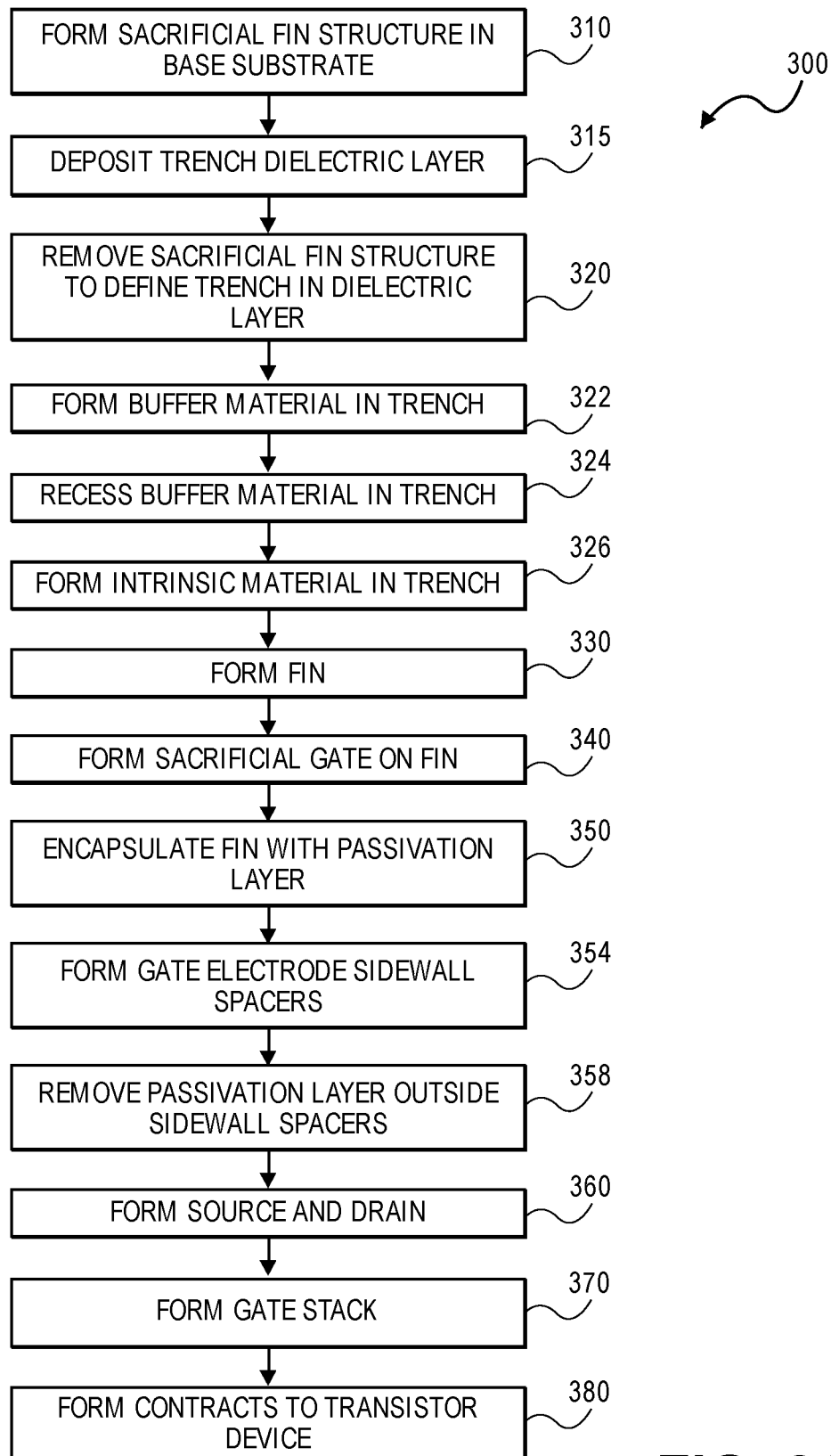
FIG. 21 presents a flow chart of a process of forming the transistor device illustrated in FIGS. 2-20.

FIGS. 2-20 describe a process for forming an FET such as illustrated in FIG. 1. FIG. 21 presents a flow chart of the process. FIGS. 2-20 describe a three-dimensional multi-gate FET including a passivated underlap between a gate electrode and a source and a drain of the transistor. The concept to include a passivated underlap can similarly be applied to planar transistors and gate all around transistors. Referring to FIG. 2 and with reference to the flow chart of FIG. 21, the process begins by defining sacrificial fin structures in a substrate material (block 310, FIG. 21). FIG. 2 shows a perspective side view of structure 200 of substrate 210 that may be any material that may serve as a foundation of which a multi-gate FET may be constructed. Representatively, substrate 210 is a portion of a larger substrate such as wafer. In one embodiment, substrate 210 is a semiconductor material such as single crystal silicon. Substrate 210 may be a bulk substrate or, in another embodiment, a semiconductor on insulator (SOI) structure. FIG. 2 shows substrate 210 following a patterning of the substrate to define sacrificial fin 2100. Sacrificial fin 2100 may be one of many sacrificial fins formed in the substrate. Sacrificial fin 2100 may be formed by a mask and etch process wherein a mask (e.g., a hard mask) is introduced on a surface (superior surface) of substrate 210 to protect areas of the substrate where the sacrificial fins will be defined and to provide openings in non-fin areas. Once the mask is patterned, substrate 210 may be etched to remove material in unprotected areas. A substrate of silicon may be etched with a wet or dry etch. Representatively, a suitable etchant is chlorine or fluorine plasma based etch chemistry. In one embodiment, sacrificial fin 2100 is etched to have a height, H, on the order of 100 nanometers (nm) to 400 nm.

Figure 3:
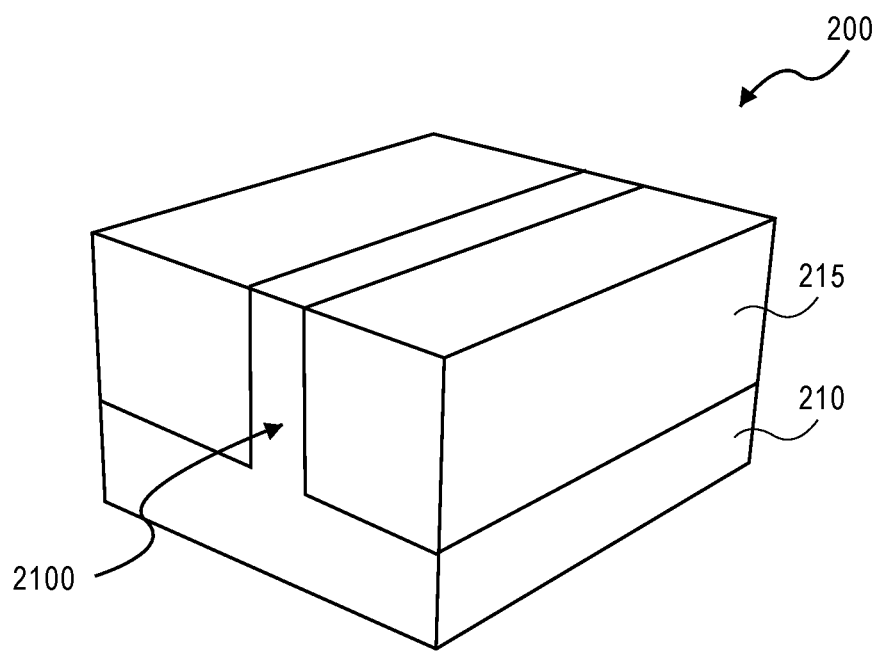
FIG. 3 shows the structure of FIG. 2 having a trench dielectric layer on the substrate surrounding the sacrificial fin.

FIG. 3 shows structure 200 of FIG. 2 following a removal of the mask on the fin and following the deposition of a trench dielectric layer on the substrate (block 315, FIG. 21). In one embodiment, dielectric layer 215 is silicon dioxide or a low-k dielectric material. Following deposition of dielectric layer 215, a surface of the structure (a superior surface as viewed) is polished to the level of the top of sacrificial fin 2100 so that the fin is exposed.

Figure 4:
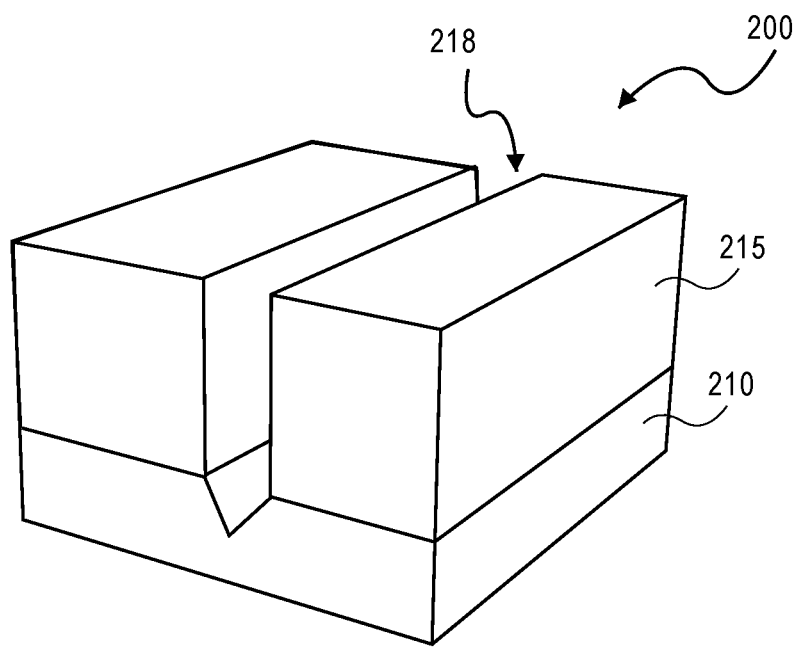
FIG. 4 shows the structure of FIG. 3 following the removal of the sacrificial fin to form a trench of a controlled size and shape.

FIG. 4 shows structure 200 of FIG. 3 following the removal of sacrificial fin 2100 to form a trench of a controlled size and shape (block 320, FIG. 21). The sacrificial fin may be removed by a mask and etch process wherein a mask is patterned on a surface of dielectric layer 215 leaving sacrificial fin 2100 exposed followed by an etch process to remove the fin. Sacrificial fins of a silicon material may be etched by a dry or wet etch or a combination of the two. Suitable etchants for etching sacrificial fins of a silicon material include potassium hydroxide (KOH) and tetramethylammonium hydroxide (TMAH). The removal of the sacrificial fin forms trench 218. In one embodiment, the etching of the sacrificial fin may be performed to provide a {111} faceting at the bottom of trench 218 to facilitate a growth of a group III-V compound material in the trench which is done using TMAH-like or any equivalent chemistry. Alternative geometries are also contemplated.

Figure 5:
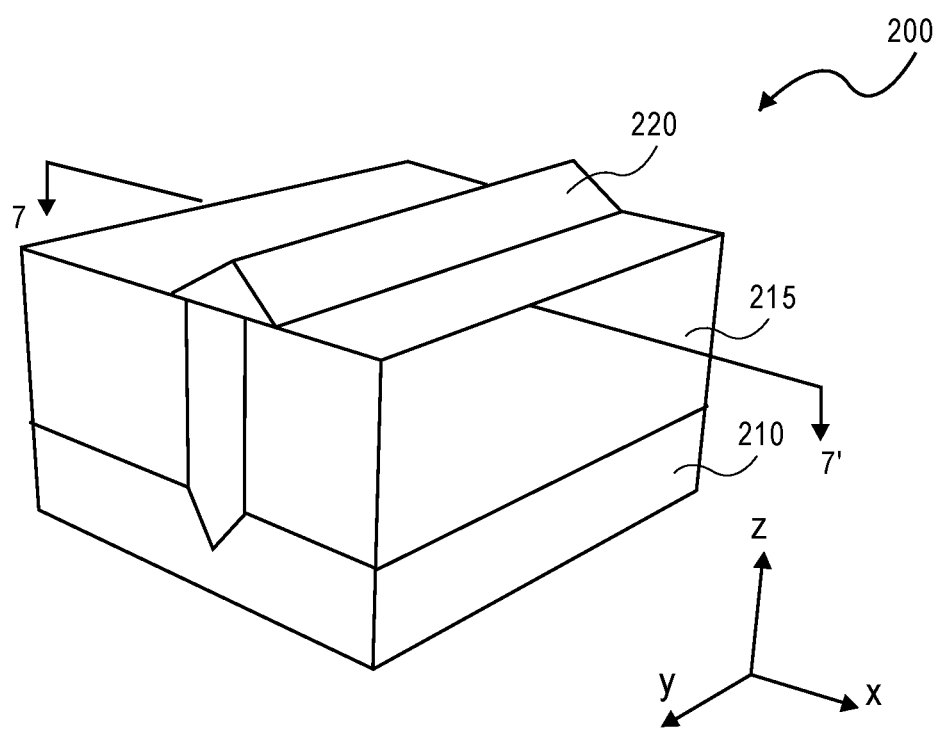
FIG. 5 shows the structure of FIG. 4 following the introduction of a buffer material in the trench.

FIG. 5 shows structure 200 of FIG. 4 following the introduction of a buffer material in trench 218 (block 322, FIG. 21). In one embodiment, buffer material 220 is a group III-V compound material such as, but not limited to, gallium arsenide (GaAs), indium phosphide (InP); silicon germanium (SiGe), gallium phosphide (GaP), gallium arsenide antimony (GaAsSb), indium aluminum arsenide (InAlAs) and gallium antimony (GaSb). The buffer material may be introduced by an epitaxial growth process. In another embodiment, the trenches may be filled with a first buffer material of one of the noted materials as, for example, a nucleation layer at a base of trench 218 followed by a second buffer material of another of the noted materials. The trench confined growth of a buffer material or materials offer an advantage of aspect ratio trapping (ART) whereby crystalline quality of the epitaxial layer(s) is enhanced through trapping of threading dislocations, stacking faults, twins, etc., at sidewalls of a trench where defects terminate such that overlying layers may be increasingly defect-free. FIG. 5 shows buffer material 220 in trench 218. The buffer material has a dimension measured in z direction on the order of 100 nm to 400 nm. FIG. 5 representatively shows buffer material 220 including {111} faceted overgrowth protruding off the superior plane defined by dielectric layer 215.

Figure 6:
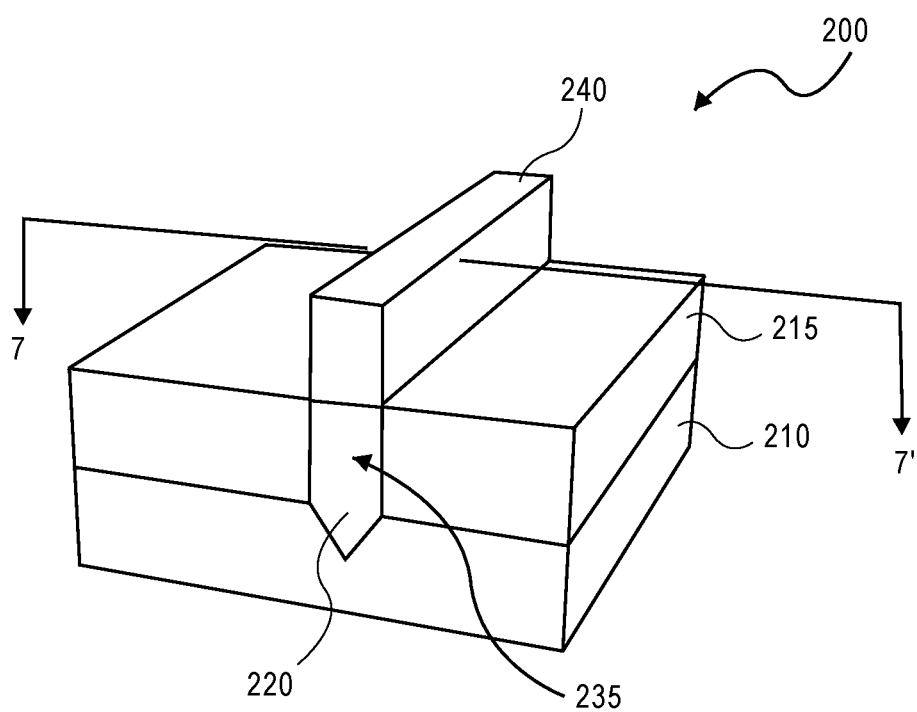
FIG. 6 shows the structure of FIG. 5 following a removal of a portion of the buffer material in the trench and the introduction of an intrinsic material into the trench.
Figure 7:
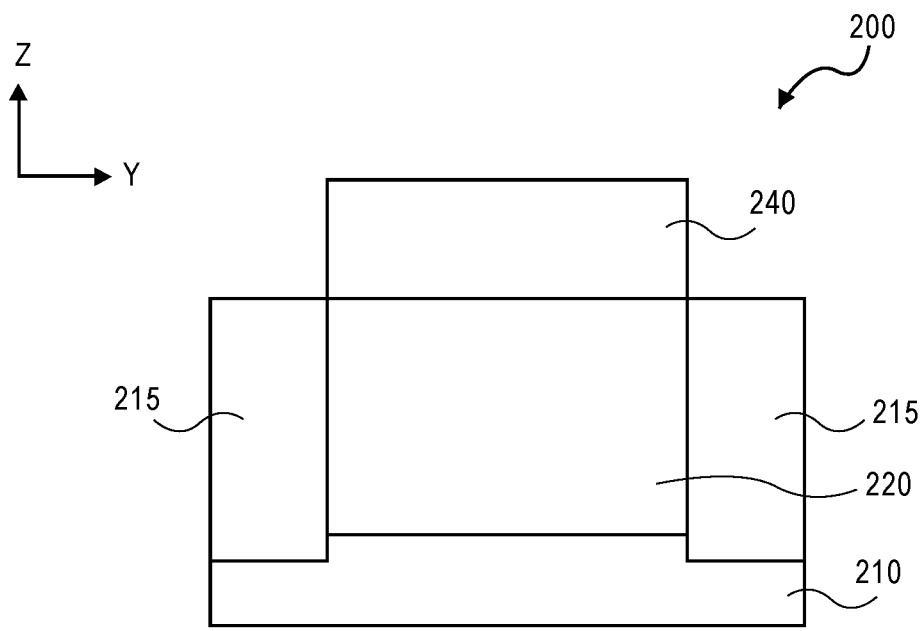
FIG. 7 shows a cross-sectional side view of the structure of FIG. 6 through line 7-7'.

FIG. 6 shows structure 200 of FIG. 5 following a removal of a portion of buffer material 220 in trench 218 and the introduction of an intrinsic material into the trench. In one embodiment, the removal of buffer material 220 is performed by an etch to recess the buffer material in the trench (block 324, FIG. 21). A suitable etchant for buffer material 220 is peroxide/acid solution or any equivalent chemistry. FIG. 6 shows intrinsic layer 240 formed on buffer material 220 (block 326, FIG. 21). The intrinsic layer may be epitaxially grown. In one embodiment, intrinsic layer 240 is a germanium. Intrinsic layer 240 has a representative height on the order of 40 nm to 100 nm. FIG. 6 shows the structure following a polish of the intrinsic layer to a plane defined by dielectric layer 215 and after a recession of dielectric layer 215 such that intrinsic layer 240 is protruding above a plane defined by dielectric layer 215 as a fin structure (block 330, FIG. 21). FIG. 7 shows a cross-sectional side view of the structure of FIG. 6 through line 7-7'. A representative height of the exposed fin is representatively on the order of 500 angstroms (Å).

Figure 8:
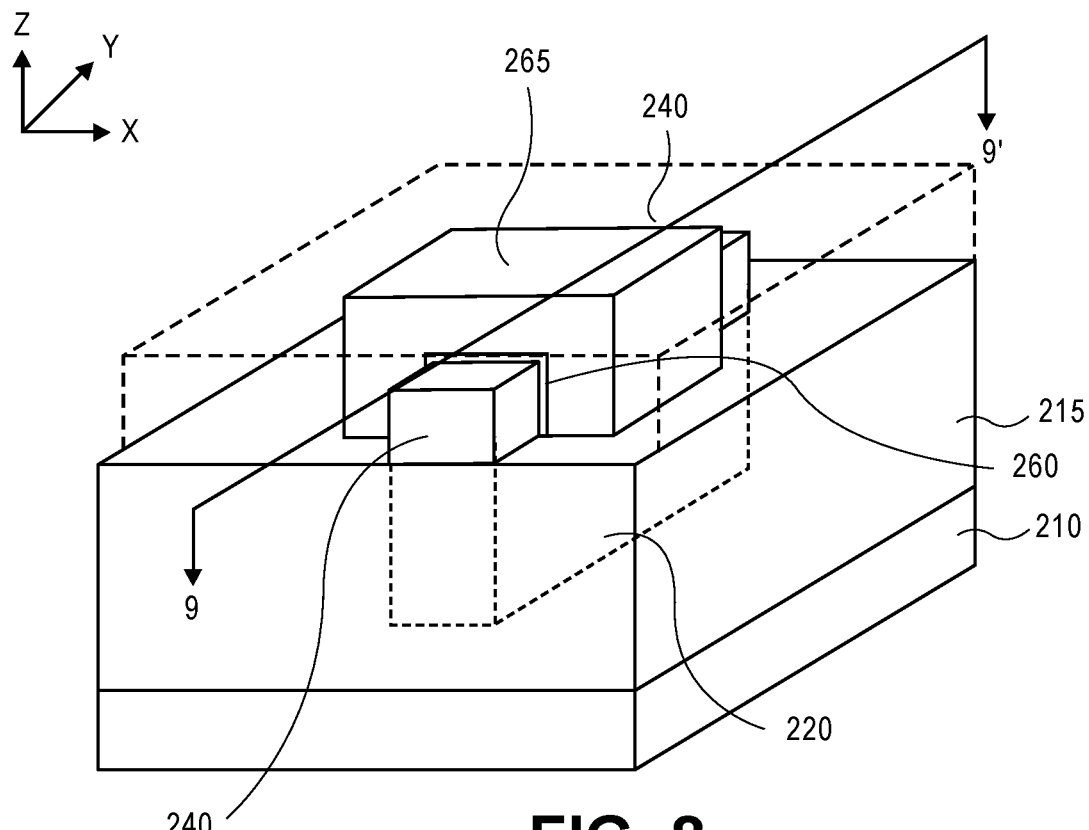
FIG. 8 shows a top side perspective view of the structure of FIG. 6 following the formation of a sacrificial or dummy gate stack on fin portion of an intrinsic layer extending above a dielectric layer.

FIG. 8 shows a top side perspective view of structure 200 of FIG. 6 following the formation of a sacrificial or dummy gate stack on the fin portion of intrinsic layer 240 extending above dielectric layer 215 (block 340, FIG. 21). In one embodiment, a gate stack includes gate dielectric layer 260 of, for example, silicon dioxide or a high-k dielectric material. Disposed on gate dielectric layer 260, in one embodiment, is dummy gate 265 of, for example, polysilicon deposited by, for example, a chemical vapor deposition method. In one embodiment, prior to forming the gate stack, a dielectric layer of silicon dioxide or a low k material is introduced on the structure include an intrinsic layer 240. The dielectric layer is shown in dashed lines. To form the gate stack, a mask material is introduced over the structure on the dielectric layer and patterned to have an opening through the dielectric layer in an area for the gate stack. The gate stack is then introduced in the opening.

Figure 9:
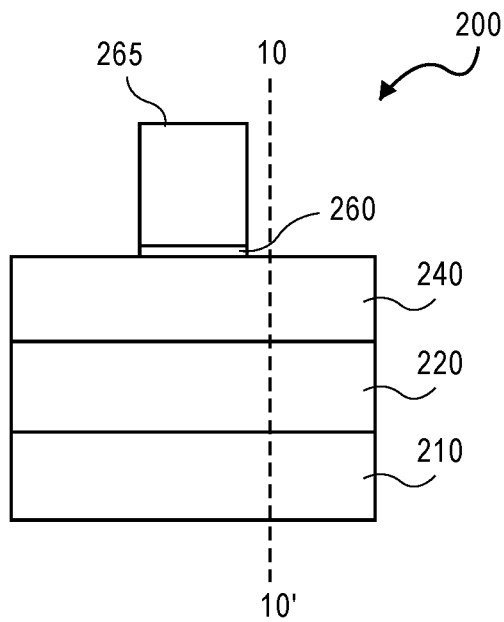
FIG. 9 shows the structure of FIG. 8 through line 9-9' showing the gate stack of a gate dielectric and a dummy gate on the fin defined by an intrinsic layer.
Figure 10:
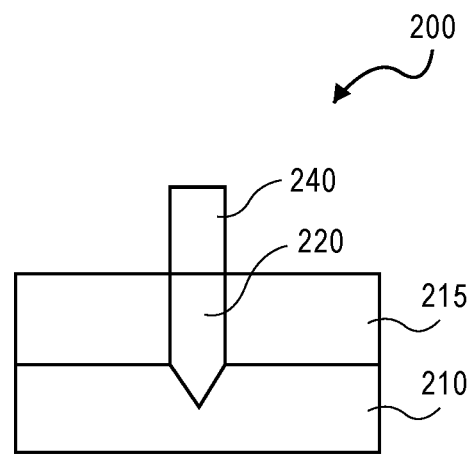
FIG. 10 shows a cross-section of the structure through line 10-10' of FIG. 9 (a fin cut).

FIG. 9 shows structure 200 of FIG. 8 through line 9-9' showing the gate stack of gate dielectric 260 and dummy gate 265 on the fin defined by intrinsic layer 240 (a yz-dimension or gate cut). FIG. 10 shows a cross-section of structure 200 through line 10-10' of FIG. 9 (a fin cut).

Figure 11:
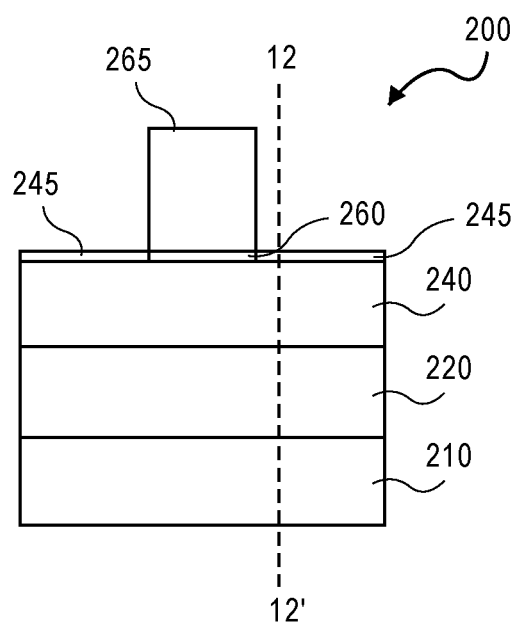
FIG. 11 shows the structure of FIG. 9 following the formation of a passivation layer on a surface of an intrinsic layer.
Figure 12:
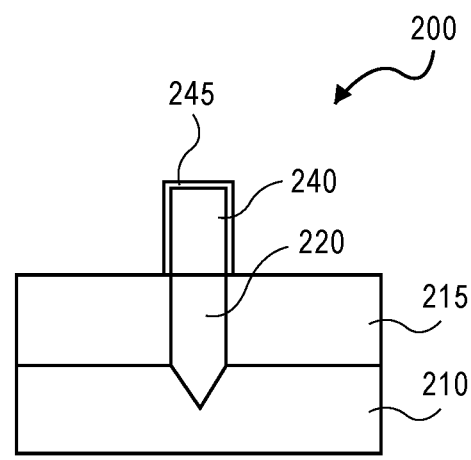
FIG. 12 shows a cross-section of the structure of FIG. 11 through line 12-12'.

FIG. 11 shows structure 200 of FIG. 9 following the formation of a passivation layer on a surface of intrinsic layer 240 (a top surface as viewed). FIG. 12 shows a cross-section of the structure of FIG. 11 through line 12-12'. In one embodiment, passivation layer 245 is an epitaxial layer of silicon that is selectively grown on intrinsic layer 240 to encapsulate the fin structure (block 350, FIG. 21). A representative thickness of passivation layer is on the order of 3 Å to 9 Å.

Figure 13:
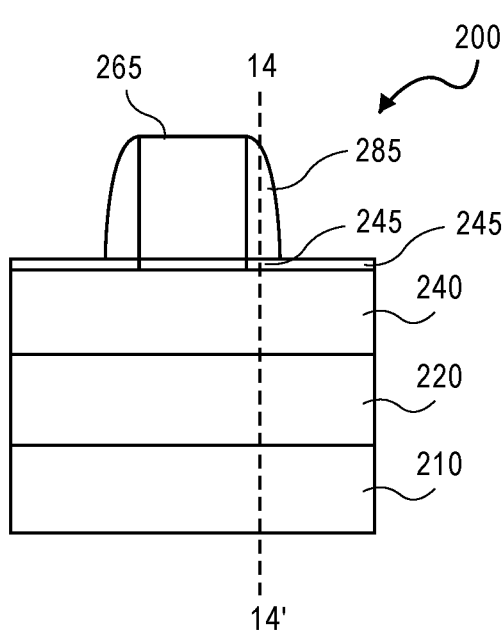
FIG. 13 shows the structure of FIG. 11 following the formation of gate sidewall spacers adjacent the gate stack.
Figure 14:
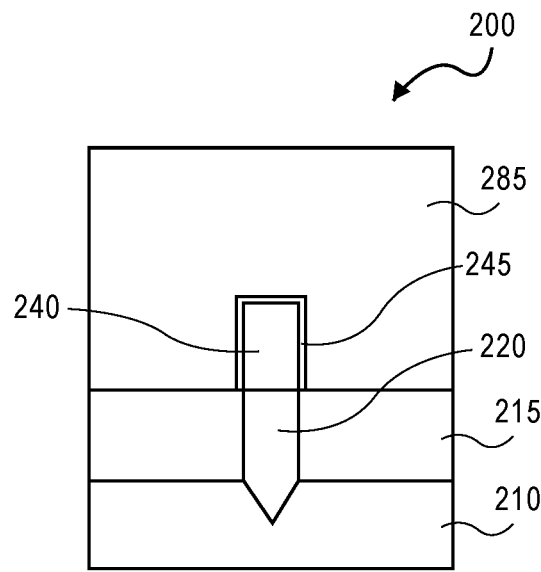
FIG. 14 shows a cross-section of the structure of FIG. 13 through line 14-14'.

FIG. 13 shows structure 200 of FIG. 11 following the formation of gate sidewall spacers adjacent the gate stack including dummy gate 265. FIG. 14 shows a cross-section of the structure of FIG. 13 through line 14-14'. In one embodiment, gate sidewall spacers 285 are a dielectric material such as silicon dioxide or a low k dielectric material. The dielectric material is representatively formed on a surface of the structure as a blanket by, for example, a chemical vapor deposition process. The dielectric material is then patterned into spacers by a mask and etch process (block 354, FIG. 21). FIG. 13 shows sidewall spacers 285 on passivation layer 245 and disposed on opposite sides of dummy gate 265. In one embodiment, a thickness of a base of sidewall spacers 285 establishes an underlap, u.

Figure 15:
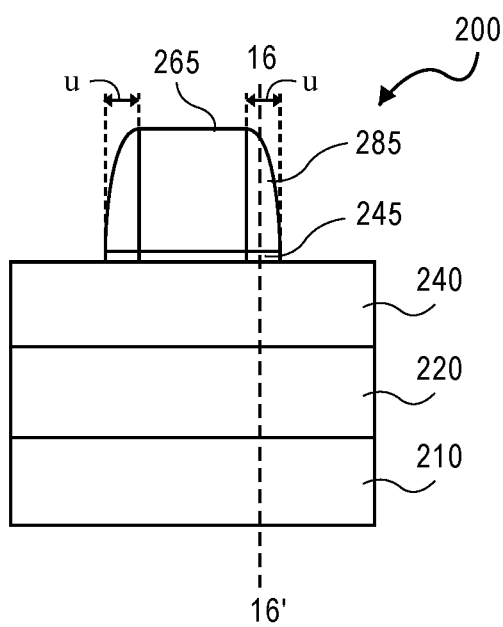
FIG. 15 shows the structure of FIG. 13 following a removal of the passivation layer in areas outside the sidewall spacers.
Figure 16:
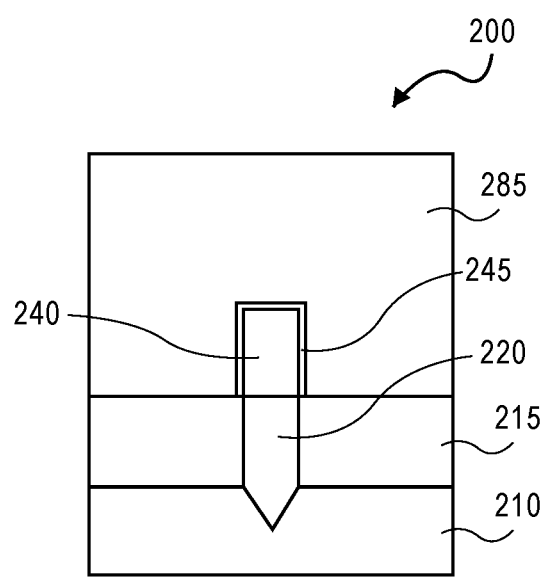
FIG. 16 shows a cross-section of the structure of FIG. 15 through line 16-16'.

FIG. 15 shows structure 200 of FIG. 13 following a removal of the passivation layer in areas outside the sidewall spacers. FIG. 16 shows a cross-section of the structure of FIG. 15 through line 16-16'. In one embodiment, passivation layer 245 is removed by a selective etch process with sidewall spacers 285 acting as a mask to protect passivation layer 245 underneath (block 358, FIG. 21). For a passivation layer of silicon, a representative etch chemistry is HF-based chemistry.

FIG. 17 shows structure 200 of FIG. 15 following the formation of a source and a drain. FIG. 18 shows a cross-section of the structure of FIG. 17 through line 18-18'. In one embodiment, source 250 and drain 255 are formed by initially removing portions of intrinsic layer 240 corresponding to diffusion regions (source and drain regions) in the fin. Representatively, an etch under cut (EUC) is performed to remove portions of intrinsic layer 240 in areas corresponding to a source region and a drain region with dummy gate 265 and sidewall spacers 285 protecting intrinsic layer 240 in a channel region. Following a removal of portions of intrinsic layer 240 in source and drain regions to leave voids, source 250 and drain 255 are formed in respective voids (block 360, FIG. 21). In one embodiment where intrinsic layer 240 is germanium, source 250 and drain 255 are a highly doped germanium (p++) such as a boron-doped germanium that is epitaxially grown.

FIG. 19 shows structure 200 of FIG. 17 following the replacement of the gate stack. FIG. 20 shows a cross-section of the structure of FIG. 19 through line 20-20'. Following formation of source 250 and drain 255, a dielectric material is introduced on the structure (on a surface including source 250, drain 255 and dummy gate 265). In one embodiment, dielectric material 290 (an ILD0) is silicon dioxide or a low k material or a combination of materials (e.g., multiple low k materials or silicon dioxide and one or more low k materials). Sacrificial gate 265 and gate dielectric 260 are then removed by, for example, masking dielectric material 290 with an opening to expose the gate stack and then an etch process to remove dummy gate 265 and gate dielectric 260. The gate stack is replaced initially with gate dielectric 270 of, for example, silicon dioxide, a high-k material or a combination of silicon dioxide and a high-k material. This is followed by the formation of gate electrode 275 such as a metal gate electrode (block 370, FIG. 21). This is a typical gate-last process flow. Representative materials for gate electrode 275 include, but are not limited to, tungsten, tantalum, titanium or a nitride, a metal alloy or another material. Following formation of gate electrode 275, contacts may be made to source 250 and drain 255 (and gate electrode 275) to form the device shown in FIG. 1 (block 380, FIG. 21).

Figure 22:
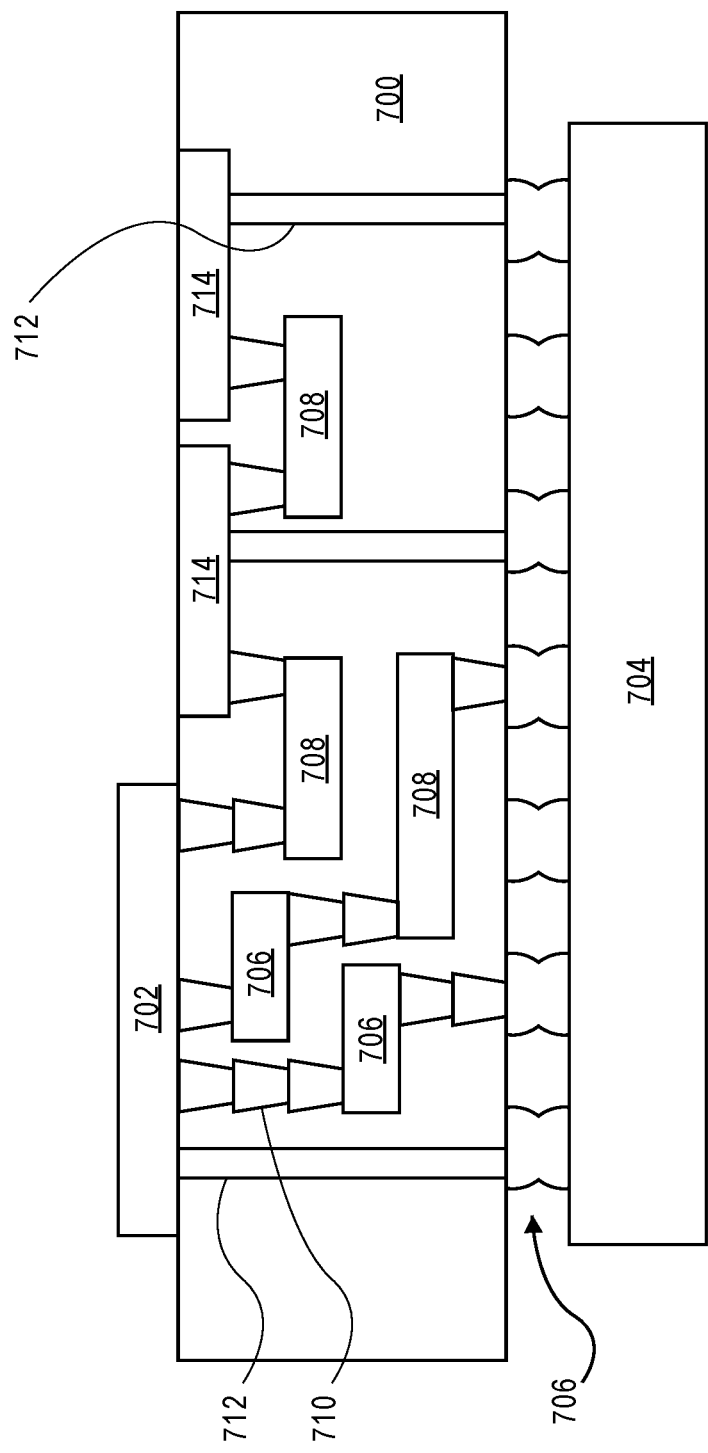
FIG. 22 is an interposer implementing one or more embodiments.

FIG. 22 illustrates interposer 700 that includes one or more embodiments. Interposer 700 is an intervening substrate used to bridge a first substrate 702 to second substrate 704. First substrate 702 may be, for instance, an integrated circuit die. Second substrate 704 may be, for instance, a memory module, a computer motherboard, or another integrated circuit die. Generally, the purpose of interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of interposer 700. In other embodiments, the first and second substrates 702/704 are attached to the same side of interposer 700. In further embodiments, three or more substrates are interconnected by way of interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 700.

In accordance with embodiments, apparatuses or processes disclosed herein may be used in the fabrication of interposer 700.

Figure 23:
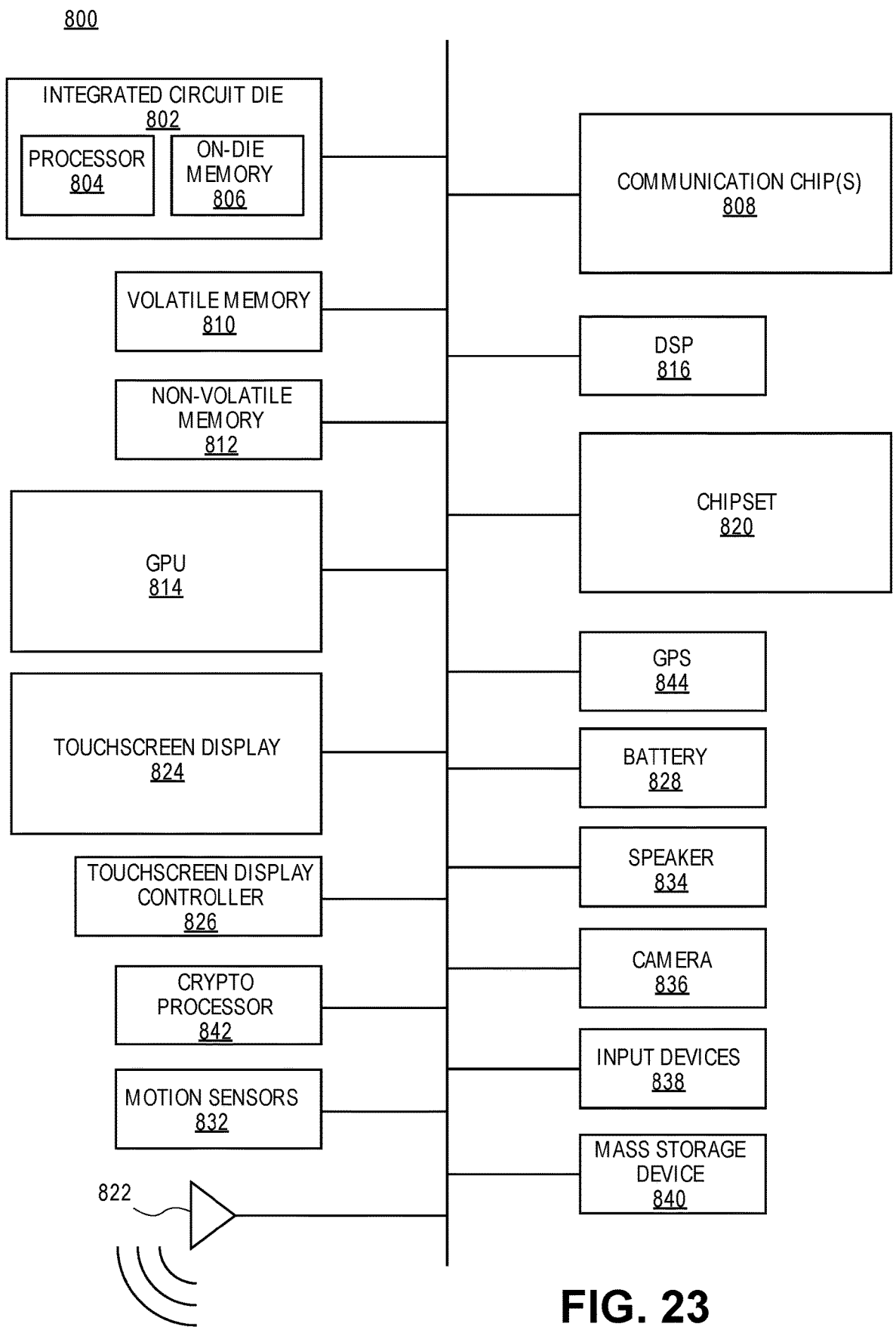
FIG. 23 illustrates an embodiment of a computing device.

FIG. 23 illustrates a computing device 800 in accordance with one embodiment. The computing device 800 may include a number of components. In one embodiment, these components are attached to one or more motherboards. In an alternate embodiment, these components are fabricated onto a single system-on-a-chip (SoC) die rather than a motherboard. The components in the computing device 800 include, but are not limited to, an integrated circuit die 802 and at least one communication chip 808. In some implementations the communication chip 808 is fabricated as part of the integrated circuit die 802. The integrated circuit die 802 may include a CPU 804 as well as on-die memory 806, often used as cache memory, that can be provided by technologies such as embedded DRAM (eDRAM) or spin-transfer torque memory (STTM or STTM-RAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 828 or other power source, a power amplifier (not shown), a global positioning system (GPS) device 844, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications chip 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 808. For instance, a first communication chip 808 may be dedicated to shorter range wireless communications such as Wi-Fi and Bluetooth and a second communication chip 808 may be dedicated to longer range wireless communications such as GPS, EDGE, GPRS, CDMA, WiMAX, LTE, Ev-DO, and others.

The processor 804 of the computing device 800 includes one or more devices, such as transistors, that are formed in accordance with embodiments described above. The term "processor" may refer to any device or portion of a device that processes electronic data from registers and/or memory to transform that electronic data into other electronic data that may be stored in registers and/or memory.

The communication chip 808 may also include one or more devices, such as transistors, that are formed in accordance with embodiments.

In further embodiments, another component housed within the computing device 800 may contain one or more devices, such as transistors, that are formed in accordance with implementations.

In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

EXAMPLES

The following examples pertain to embodiments:

Example 1 is an apparatus including a transistor device including a channel disposed on a substrate between a source and a drain, a gate electrode disposed on the channel, wherein the channel includes a length dimension between the source and the drain that is greater than a length dimension of the gate electrode such that there is an underlap between an edge of the gate electrode and an edge of the channel relative to each of the source and the drain, wherein the underlap is passivated.

In Example 2, the channel of the apparatus of Example 1 includes germanium.

In Example 3, the underlap of the apparatus of Example 1 is passivated with silicon.

In Example 4, the silicon of the apparatus of Example 3 has a thickness of 3 angstroms to 9 angstroms.

In Example 5, the apparatus of Example 1 further includes a sidewall spacer on the underlap.

In Example 6, the underlap of the apparatus of Example 1 is at least two nanometers.

In Example 7, the transistor device of the apparatus of Example 1 includes a p-type transistor device.

Example 8 is an apparatus including a p-type transistor device including a channel including germanium between a source and a drain, each of the source and the drain separated from the channel by an underlap; a passivation layer on the underlap; and a gate stack on the channel, the gate stack including a gate dielectric and a gate electrode.

In Example 9, the passivation layer of the apparatus of Example 8 is silicon.

In Example 10, the apparatus of Example 8, further includes a dielectric spacer on the underlap.

In Example 11, the dielectric spacer of the apparatus of Example 10 contacts a sidewall of the gate electrode.

In Example 12, the channel and the underlap of the apparatus of Example 8 include opposing sidewalls projecting above the substrate and the passivation layer conforms to the sidewalls.

In Example 13, the underlap of the apparatus of Example 8 is at least two nanometers.

In Example 14, the silicon germanium of the buffer layer of the apparatus of Example 8 includes the same lattice constant as the germanium of the channel.

In Example 15, the transistor device of the apparatus of Example 8 includes a p-type transistor device.

Example 15 is a method including forming a channel of a transistor device on a substrate; forming a first passivation layer on a surface of substrate on one side of the channel and a second passivation layer on an opposite side of the channel; forming a gate stack on the channel between the first passivation layer and the second passivation layer; and forming a source on the substrate between the channel and the first passivation layer and a drain on the substrate between the channel and the second passivation layer.

In Example 17, the method of Example 16 further includes forming a first spacer on the first passivation layer and a second spacer on the second passivation layer.

In Example 18, forming the first passivation layer and the second passivation layer of the method of Example 16 include epitaxially growing a material.

In Example 19, the material of the method of Example 18 includes silicon.

In Example 20, the channel of the method of Example 16 includes germanium.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a transistor device comprising a channel material disposed above a substrate, the channel material having an upper portion comprising a channel between a source and a drain, and the channel material having a lower portion extending beneath the source and the drain, a gate stack disposed on the channel, the gate stack comprising a gate dielectric and a gate electrode, wherein the channel comprises a length dimension between the source and the drain that is greater than a length dimension of the gate electrode such that there is an underlap between an edge of the gate electrode and an edge of the channel relative to each of the source and the drain, wherein the underlap is passivated with a passivation layer, and wherein the passivation layer is not vertically beneath the gate electrode.

2. The apparatus of claim 1, wherein the channel material comprises germanium.

3. The apparatus of claim 1, wherein the underlap is passivated with silicon.

4. The apparatus of claim 3, wherein the silicon has a thickness of 3 angstroms to 9 angstroms.

5. The apparatus of claim 1, further comprising a sidewall spacer on the underlap.

6. The apparatus of claim 1, wherein the underlap is at least two nanometers.

7. The apparatus of claim 1, wherein the transistor device comprises a p-type transistor device.

8. An apparatus comprising:
a p-type transistor device comprising:
a channel material comprising germanium, the channel material having an upper portion comprising a channel between a source and a drain, and the channel material having a lower portion extending beneath the source and the drain, each of the source and the drain separated from the channel by an underlap;
a passivation layer on the underlap; and
a gate stack on the channel, the gate stack comprising a gate dielectric and a gate electrode, wherein the passivation layer is not vertically beneath the gate electrode.

9. The apparatus of claim 8, wherein the passivation layer is silicon.

10. The apparatus of claim 8, further comprising a dielectric spacer on the underlap.

11. The apparatus of claim 10, wherein the dielectric spacer contacts a sidewall of the gate electrode.

12. The apparatus of claim 8, wherein the channel and the underlap comprise opposing sidewalls projecting above the substrate and the passivation layer conforms to the sidewalls.

13. The apparatus of claim 8, wherein the underlap has a width of at least two nanometers.

14. The apparatus of claim 8, further comprising a buffer layer comprising silicon germanium, wherein the silicon germanium of the buffer layer comprises the same lattice constant as the germanium of the channel material.

15. The apparatus of claim 8, wherein the transistor device comprises a p-type transistor device.

16. A method comprising:
forming a channel material of a transistor device above a substrate;
forming a first passivation layer on a surface of substrate on one side of the channel material and a second passivation layer on an opposite side of the channel material;
forming a gate stack on the channel between the first passivation layer and the second passivation layer, the gate stack comprising a gate dielectric and a gate electrode, wherein the first and second passivation layers are not vertically beneath the gate electrode; and
forming a source on the substrate between the channel material and the first passivation layer and a drain above the substrate between the channel material and the second passivation layer, wherein the channel material has an upper portion comprising a channel between the source and the drain, and the channel material having a lower portion extending beneath the source and the drain.

17. The method of claim 16, further comprising forming a first spacer on the first passivation layer and a second spacer on the second passivation layer.

18. The method of claim 16, wherein forming the first passivation layer and the second passivation layer comprise epitaxially growing a material.

19. The method of claim 18, wherein the material comprises silicon.

20. The method of claim 16, wherein the channel material comprises germanium.

* * * * *